US012702019B2

(12) United States Patent
Lee et al.

(10) Patent No.: US 12,702,019 B2
(45) Date of Patent: Aug. 4, 2026

(54) SEMICONDUCTOR PACKAGE

(71) Applicant: SAMSUNG ELECTRONICS CO., LTD., Suwon-si (KR)

(72) Inventors: Kanggyune Lee, Suwon-si (KR); Sangwon Lee, Suwon-si (KR); Woojin Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 407 days.

(21) Appl. No.: 18/336,313

(22) Filed: Jun. 16, 2023

(65) Prior Publication Data

US 2024/0105636 A1     Mar. 28, 2024

(30) Foreign Application Priority Data

Sep. 22, 2022    (KR) ........................ 10-2022-0120092

(51) Int. Cl.
| | |
|---|---|
| *H10W 46/00* | (2026.01) |
| *H10W 40/10* | (2026.01) |
| *H10W 74/10* | (2026.01) |
| H10W 72/20 | (2026.01) |
| H10W 74/01 | (2026.01) |
| H10W 90/00 | (2026.01) |
| H10W 90/24 | (2026.01) |

(52) U.S. Cl.
CPC ......... *H10W 46/607* (2026.01); *H10W 40/10* (2026.01); *H10W 46/00* (2026.01); *H10W 46/401* (2026.01); *H10W 74/117* (2026.01); *H10W 72/20* (2026.01); *H10W 74/014* (2026.01); *H10W 90/00* (2026.01); *H10W*

90/24 (2026.01); *H10W 90/722* (2026.01); *H10W 90/724* (2026.01)

(58) Field of Classification Search
CPC ......... H01L 23/544; H01L 23/31–3142; H01L 23/28; H01L 2223/544–54493; H10W 46/607

See application file for complete search history.

(56) References Cited

U.S. PATENT DOCUMENTS

| | | | |
|---|---|---|---|
| 7,884,472 | B2 | 2/2011 | Chen et al. |
| 9,035,308 | B2 | 5/2015 | Yim et al. |
| 9,665,122 | B2 | 5/2017 | Kwon et al. |
| 10,068,881 | B2 | 9/2018 | Kwon |
| 11,342,297 | B2 | 5/2022 | Chen et al. |
| 2009/0289331 | A1* | 11/2009 | Ueta ..................... H01L 23/544 257/E23.179 |

(Continued)

FOREIGN PATENT DOCUMENTS

| | | |
|---|---|---|
| KR | 20160001169 A | 1/2016 |
| KR | 10-2016-0094768 A | 8/2016 |

(Continued)

*Primary Examiner* — Yu Chen

(74) *Attorney, Agent, or Firm* — Wolf, Greenfield & Sacks, P.C.

(57) ABSTRACT

A semiconductor package includes a package substrate, a first semiconductor chip on the package substrate, a sealing layer on the package substrate and at least partially covering the first semiconductor chip and including an upper surface, a first side surface, and a first inclined surface extending between the upper surface and the first side surface, and a first marking pattern in or on the first inclined surface of the sealing layer.

20 Claims, 14 Drawing Sheets

17

(56)         References Cited

U.S. PATENT DOCUMENTS

2015/0380359  A1      12/2015  Lim
2016/0225721  A1       8/2016  Choi et al.
2022/0077036  A1*     3/2022  Matsubara ............. H01L 24/49

FOREIGN PATENT DOCUMENTS

KR      10-2021-0146165  A      12/2021
KR      10-2022-0019148  A       2/2022

* cited by examiner

SEMICONDUCTOR PACKAGE

CROSS-REFERENCE TO RELATED APPLICATION

This application claims priority under 35 U.S.C. § 119 to Korean Patent Application No. 10-2022-0120092, filed on Sep. 22, 2022, in the Korean Intellectual Property Office, the disclosure of which is incorporated by reference herein in its entirety.

BACKGROUND

The inventive concept relates to semiconductor packages.

Recently, the demand for portable devices has rapidly increased in the electronic product market, and thus, electronic components mounted in such products have been consistently required to be smaller in size and lighter in weight. To make electronic components smaller in size and lighter in weight, there is a trend of reducing the total thicknesses of semiconductor packages.

SUMMARY

The inventive concept provides a semiconductor package.

According to an aspect of the inventive concept, there is provided a semiconductor package including a package substrate, a first semiconductor chip on the package substrate, a sealing layer on the package substrate and at least partially covering the first semiconductor chip and including an upper surface, a first side surface, and a first inclined surface extending between the upper surface and the first side surface, and a first marking pattern in or on the first inclined surface of the sealing layer.

According to another aspect of the inventive concept, there is provided a semiconductor package including a package substrate, a chip structure on an upper surface of the package substrate and including a plurality of semiconductor chips stacked in a first direction that is perpendicular to the upper surface of the package substrate, a sealing layer on the package substrate and at least partially covering the chip structure and including an upper surface, a first side surface, and a first inclined surface extending between the upper surface and the first side surface, and a first marking pattern in or on the first inclined surface of the sealing layer, wherein a distance in a first lateral direction between a first one of the plurality of semiconductor chips and the first side surface of the sealing layer is greater than a distance in the first lateral direction between a lower second one of the plurality of semiconductor chips and the first side surface of the sealing layer.

According to yet another aspect of the inventive concept, there is provided a semiconductor package including a package substrate, a chip structure on an upper surface of the package substrate and including a plurality of semiconductor chips stacked in a first direction that is perpendicular to the upper surface of the package substrate, a sealing layer on the package substrate and at least partially covering the chip structure and including an upper surface, a first side surface, a second side surface, a first inclined surface extending between the upper surface and the first side surface, and a second inclined surface extending between the upper surface and the second side surface, a first marking pattern in or on the first inclined surface of the sealing layer and overlying at least one of the plurality of semiconductor chips in the first direction, and a second marking pattern in or on the second inclined surface of the sealing layer and overlying at least one of the plurality of semiconductor chips, wherein the first inclined surface and the second inclined surface of the sealing layer are connected to each other, wherein a distance in a first lateral direction between a first one of the plurality of semiconductor chips and the first side surface of the sealing layer is greater than a distance in the first lateral direction between a lower second one of the plurality of semiconductor chips and the first side surface of the sealing layer, and wherein a distance in a second lateral direction between the first one of the plurality of semiconductor chips and the second side surface of the sealing layer is greater than a distance in the second lateral direction between the second one of the plurality of semiconductor chips and the second side surface of the sealing layer.

BRIEF DESCRIPTION OF THE DRAWINGS

Embodiments will be more clearly understood from the following detailed description taken in conjunction with the accompanying drawings in which:

FIGS. 3A to 3C are respectively cross-sectional views illustrating a method of manufacturing a semiconductor package, according to some embodiments;

FIG. 7 is a cross-sectional view illustrating a semiconductor package according to some embodiments;

FIG. 9 is a cross-sectional view illustrating a semiconductor package according to some embodiments;

FIG. 10 is a cross-sectional view illustrating a semiconductor package according to some embodiments;

DETAILED DESCRIPTION OF THE EMBODIMENTS

Figure 1:
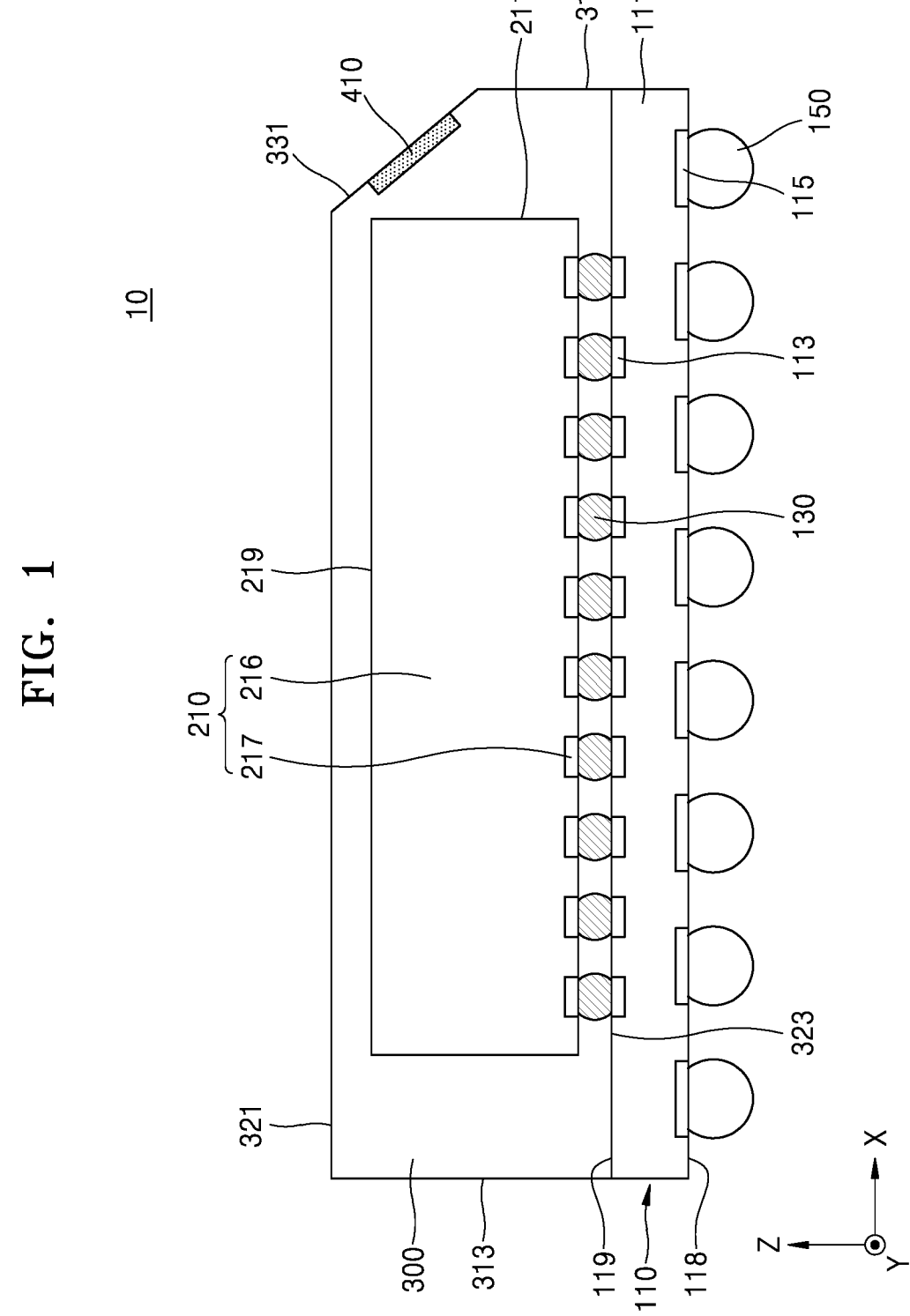
FIG. 1 is a cross-sectional view illustrating a semiconductor package according to some embodiments.

Hereinafter, embodiments of the inventive concept will be described in detail with reference to the accompanying drawings. Like components are denoted by like reference numerals throughout the specification, and repeated descriptions thereof are omitted.

Figure 2:
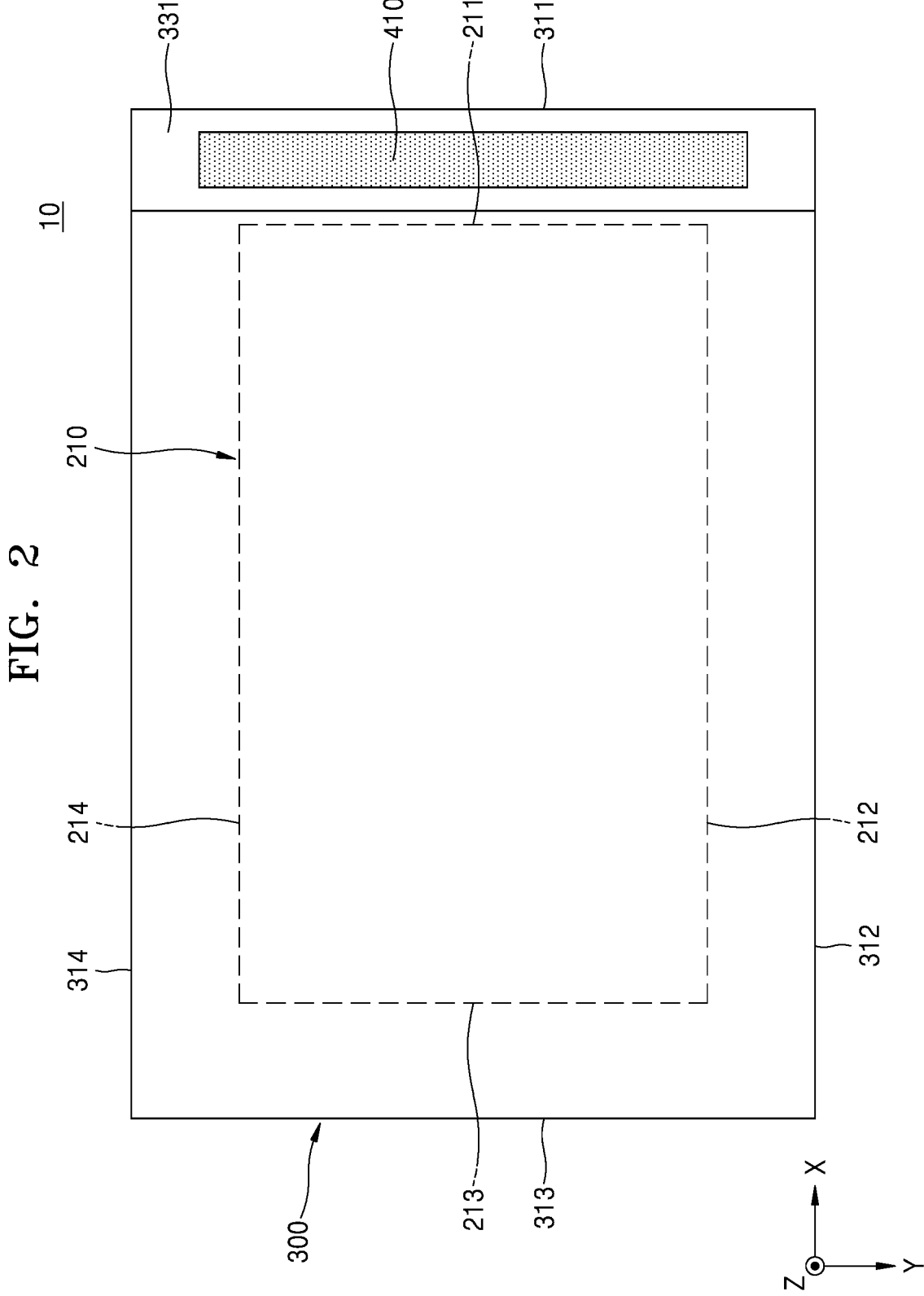
FIG. 2 is a plan view illustrating a semiconductor package according to some embodiments.

FIG. 1 is a cross-sectional view illustrating a semiconductor package 10 according to some embodiments. FIG. 2 is a plan view illustrating the semiconductor package 10 according to some embodiments.

Referring to FIGS. 1 and 2, the semiconductor package 10 may include a package substrate 110, a first semiconductor chip 210, a sealing layer 300, and a first marking pattern 410.

The package substrate 110 may substantially have a flat plate shape or a panel shape. The package substrate 110 may include an upper surface 119 and a lower surface 118, which are opposite to each other, and each of the upper surface 119 and the lower surface 118 may be a flat surface. Hereinafter, a horizontal direction (for example, an X direction and/or a Y direction) may be defined as a direction parallel to the upper surface 119 of the package substrate 110, a vertical direction (for example, a Z direction) may be defined as a direction perpendicular to the upper surface 119 of the package substrate 110, and a horizontal width may be defined as a length in the horizontal direction (for example, the X direction and/or the Y direction).

The package substrate 110 may include, for example, a printed circuit board (PCB). The package substrate 110 may include a core insulating layer 111, upper connection pads 113, and lower connection pads 115.

The core insulating layer 111 may include at least one material selected from a phenol resin, an epoxy resin, and polyimide. For example, the core insulating layer 111 may include at least one material selected from polyimide, flame retardant 4 (FR4), tetrafunctional epoxy, polyphenylene ether, epoxy/polyphenylene oxide, bismaleimide triazine (BT), Thermount, cyanate ester, and a liquid crystal polymer.

The upper connection pads 113 may be provided onto an upper surface of the core insulating layer 111. The lower connection pads 115 may be provided onto a lower surface of the core insulating layer 111. An inner wiring line for electrical connection between the upper connection pads 113 and the lower connection pads 115 may be arranged inside the core insulating layer 111.

For example, the upper connection pads 113 and the lower connection pads 115 may each include a metal, such as copper (Cu), aluminum (Al), tungsten (W), titanium (Ti), tantalum (Ta), indium (In), molybdenum (Mo), manganese (Mn), Cobalt (Co), tin (Sn), nickel (Ni), magnesium (Mg), rhenium (Re), beryllium (Be), gallium (Ga), or ruthenium (Ru), or an alloy thereof.

External connection terminals 150 may be respectively attached to the lower connection pads 115 of the package substrate 110. The external connection terminals 150 may be configured to electrically and physically connect the package substrate 110 with an external device to which the package substrate 110 is mounted. The external connection terminals 150 may each be formed of, for example, a solder ball or a solder bump.

The first semiconductor chip 210 may be mounted on the upper surface 119 of the package substrate 110. The first semiconductor chip 210 may include a semiconductor substrate 216 and chip pads 217. The semiconductor substrate 216 may include an upper surface and a lower surface, which are opposite to each other. The lower surface of the semiconductor substrate 216 may be an active surface of the semiconductor substrate 216, and the upper surface of the semiconductor substrate 216 may be an inactive surface of the semiconductor substrate 216. The semiconductor substrate 216 may be formed of a semiconductor wafer. The semiconductor substrate 216 may include, for example, silicon (Si). Alternatively, the semiconductor substrate 216 may include a semiconductor element, such as germanium (Ge), or a compound semiconductor, such as silicon carbide (SiC), gallium arsenide (GaAs), indium arsenide (InAs), or indium phosphide (InP). The semiconductor substrate 216 may include a conductive region, for example, an impurity-doped well or an impurity-doped structure. A semiconductor device layer including discrete devices may be provided on the active surface of the semiconductor substrate 216. The discrete devices may include, for example, transistors. The discrete devices may include microelectronic devices, for example, a metal-oxide-semiconductor field effect transistor (MOSFET), a system large-scale integration (LSI), an image sensor such as a CMOS imaging sensor (CIS) or the like, a micro-electro-mechanical system (MEMS), an active element, a passive element, and the like. The chip pads 217 may be provided on the lower surface of the first semiconductor chip 210 and may be electrically connected to the discrete devices of the semiconductor device layer.

The first semiconductor chip 210 may be mounted on the package substrate 110 in a flip-chip manner. The first semiconductor chip 210 may be electrically and physically connected to the package substrate 110 via first chip connection bumps 130. The first chip connection bumps 130 may be respectively attached to the chip pads 217 of the first semiconductor chip 210 and the upper connection pads 113 of the package substrate 110. The first chip connection bumps 130 may each include a solder bump.

The first semiconductor chip 210 may include a memory chip, a logic chip, a system-on-chip (SoC), a power management integrated circuit (PMIC) chip, a radio frequency integrated circuit (RFIC) chip, or the like. The memory chip may include a dynamic random access memory (DRAM) chip, a static random access memory (SRAM) chip, a magnetic random access memory (MRAM) chip, a NAND flash memory chip, and/or a high bandwidth memory (HBM) chip. The logic chip may include an application processor (AP), a micro-processor, a central processing unit (CPU), a controller, and/or an application-specific integrated circuit (ASIC). For example, the SoC may include at least two of a logic circuit, a memory circuit, a digital integrated circuit (IC), an RFIC, and an input/output circuit. The first semiconductor chip 210 may include a single semiconductor chip, or a chip stack structure in which a plurality of chips are stacked.

The sealing layer 300 may be arranged on the package substrate 110 and may at least partially cover the first semiconductor chip 210. The sealing layer 300 may cover the upper surface 119 of the package substrate 110. The sealing layer 300 may cover side surfaces and an upper surface 219 of the first semiconductor chip 210. For example, the sealing layer 300 may include an epoxy-based molding resin, a polyimide-based molding resin, or the like. For example, the sealing layer 300 may include an epoxy molding compound.

The sealing layer 300 may include a lower surface 323 contacting the upper surface 119 of the package substrate 110, an upper surface 321 opposite to the lower surface 323, and side surfaces extending between the upper surface 321 and the lower surface 323. Each of the upper surface 321 and the lower surface 323 of the sealing layer 300 may be a substantially flat surface.

In a plan view, the shape of the sealing layer 300 may be substantially the same as the shape of the package substrate 110. A horizontal width and a planar area of the sealing layer 300 may be substantially equal to a horizontal width and a planar area of the package substrate 110, respectively. The side surfaces of the sealing layer 300 may be aligned with side surfaces of the package substrate 110 in the vertical direction (for example, the Z direction). In a plan view, the sealing layer 300 may have a rectangular shape and include first to fourth side surfaces 311, 312, 313, and 314.

The sealing layer 300 may include a first inclined surface 331 extending between the upper surface 321 and the first side surface 311. The first inclined surface 331 of the sealing layer 300 may extend obliquely with respect to an extension direction of the upper surface 321 and an extension direction of the first side surface 311 (i.e., the first inclined surface 331 defines a plane that is at an angle to a plane defined by the sealing layer upper surface 321 and a plane defined by the sealing layer first side surface 311). In a cross-sectional view, in the sealing layer 300, a lower end of the first inclined surface 331 may be connected to an upper end of the first side surface 311, and an upper end of the first inclined surface 331 may be connected to an edge of the upper surface 321. In a cross-sectional view, the first side surface 311 of the sealing layer 300 may extend parallel to the vertical direction (for example, the Z direction), and the first inclined surface 331 of the sealing layer 300 may extend with a tilt with respect to the vertical direction (for example, the Z direction). In some embodiments, in a cross-sectional view, in the sealing layer 300, a contained angle between the first inclined surface 331 and the first side surface 311 may be about 10 degrees to about 80 degrees, about 20 degrees to about 70 degrees, or about 30 degrees to about 60 degrees.

In some embodiments, to form the sealing layer 300 having the first inclined surface 331, the sealing layer 300 may be formed in a cuboid shape, and then, a grinding process may be performed on the sealing layer 300 such that the sealing layer 300 has the first inclined surface 331. In some embodiments, the sealing layer 300 may be formed by a molding process using a mold block that has a processed surface corresponding to the first inclined surface 331.

The first marking pattern 410 may be arranged in the first inclined surface 331 of the sealing layer 300. The first marking pattern 410 may indicate various information, such as a manufacturer, a manufactured date, a manufacturer serial number, and the like. The first marking pattern 410 may include at least one of letters, numbers, various identification symbols, and barcodes. The first marking pattern 410 may be formed by a method, such as laser processing or inkjet printing.

In some embodiments, the first marking pattern 410 may have an engraved structure and/or an embossed structure. For example, the first marking pattern 410 may be formed by laser processing and may include a groove provided in the first inclined surface 331 of the sealing layer 300. For example, the first marking pattern 410 may be formed by inkjet printing and may include a material layer arranged on the first inclined surface 331 of the sealing layer 300.

In a semiconductor package according to a comparison example, a marking pattern is formed in an upper surface or a side surface of a sealing layer by laser processing. When the marking pattern is formed in the upper surface of the sealing layer, the thickness of the sealing layer is required to increase by as much as a region in which the marking pattern is formed. In addition, when the marking pattern is formed in the side surface of the sealing layer, it is difficult to secure the visibility of the marking pattern.

According to the semiconductor package 10 according to some embodiments, because the first marking pattern 410 is provided in the first inclined surface 331 of the sealing layer 300, the volume of the sealing layer 300 and the volume of the semiconductor package 10 may be reduced while securing the visibility of the first marking pattern 410.

Figure 3A:
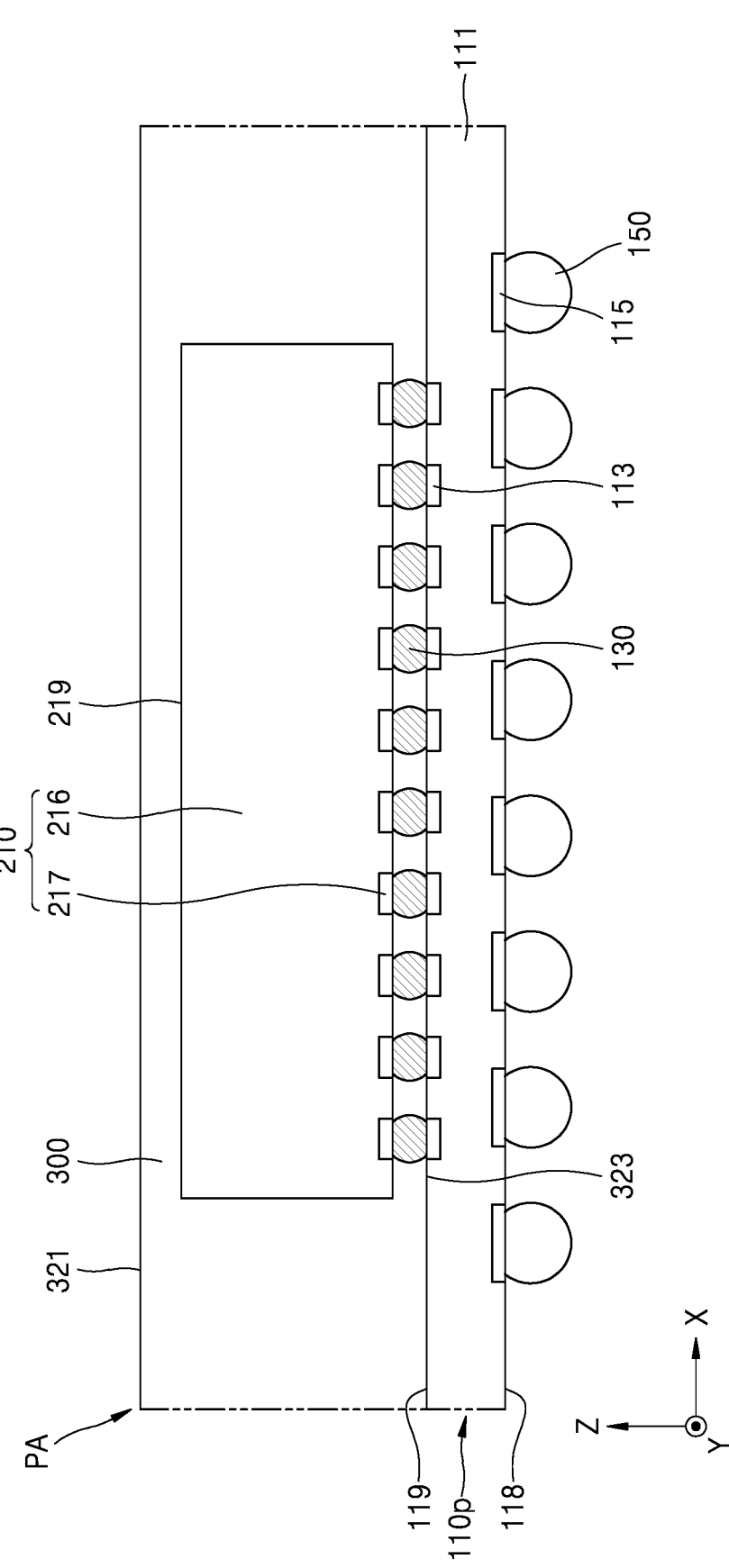
Figure 3B:
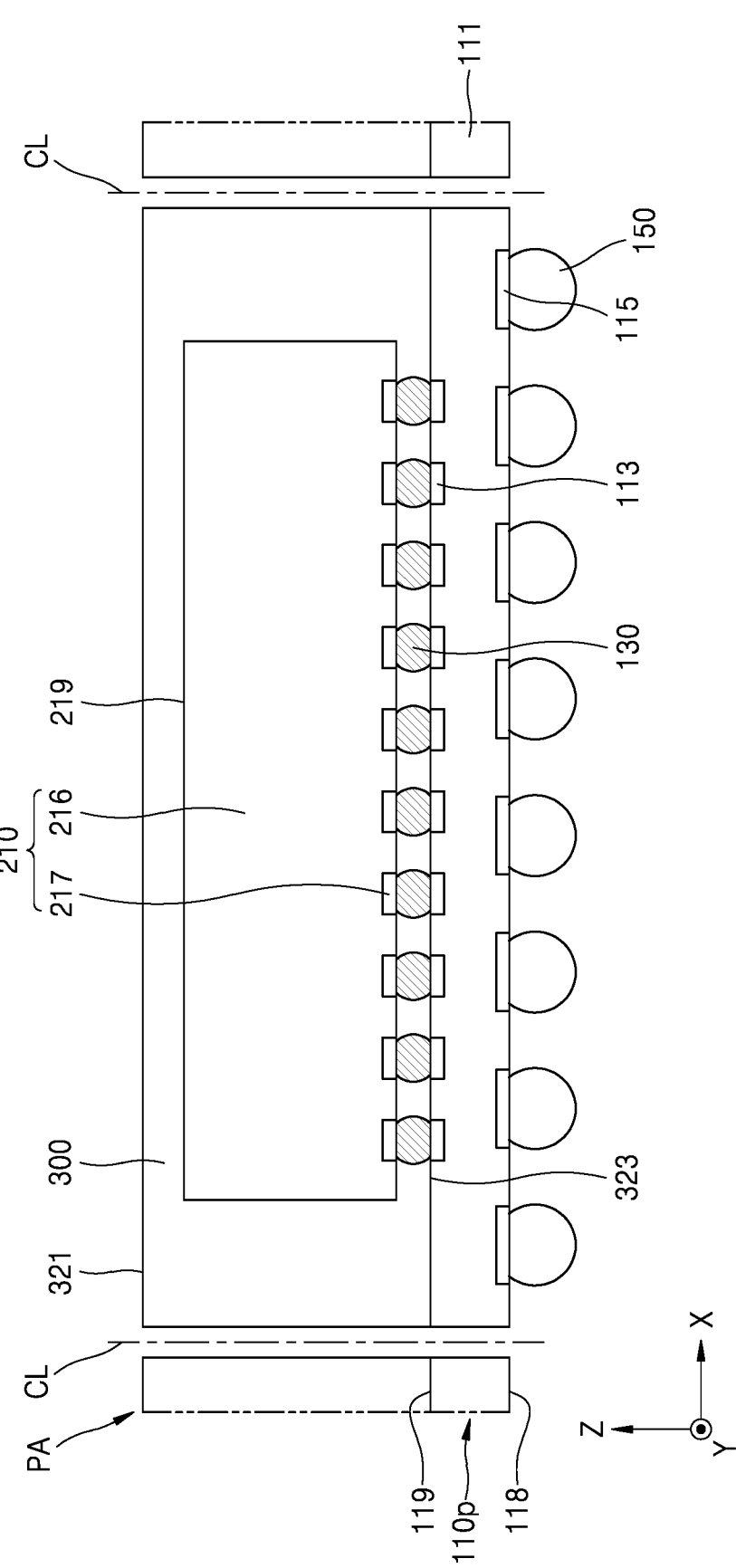
Figure 3C:
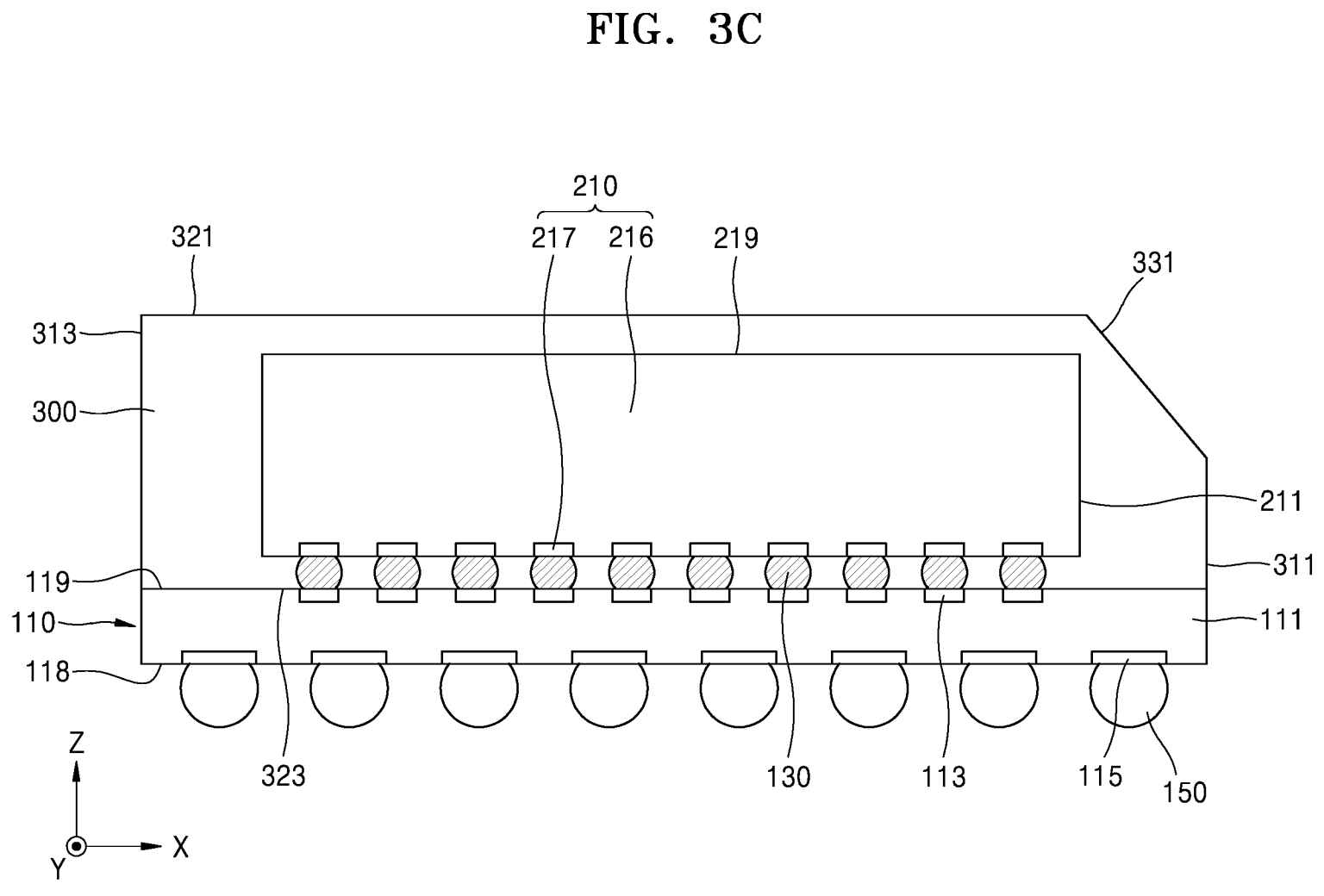

FIGS. 3A to 3C are respectively cross-sectional views illustrating a method of manufacturing a semiconductor package, according to some embodiments. Hereinafter, a method of manufacturing the semiconductor package 10 shown in FIGS. 1 and 2 is described with reference to FIGS. 3A to 3C.

Referring to FIG. 3A, the first semiconductor chip 210 is mounted on a substrate 110p. The first semiconductor chip 210 may be mounted on the substrate 110p via the first chip connection bumps 130. After the first semiconductor chip 210 is mounted on the substrate 110p, the sealing layer 300 is formed on the substrate 110p to cover the first semiconductor chip 210. As the sealing layer 300 is formed, a panel-shaped structure PA including the substrate 110p, the first semiconductor chip 210, and the sealing layer 300 may be formed.

Referring to FIG. 3B, after the sealing layer 300 is formed, the panel-shaped structure PA may be cut along a cutting line CL, thereby separating the panel-shaped structure PA into individual unit packages. The cutting line CL may vertically pass through the substrate 110p and the sealing layer 300, and a cut side surface of the substrate 110p and a cut side surface of the sealing layer 300 may be vertically aligned with each other.

Referring to FIG. 3C, in an individual unit package, the first inclined surface 331 is formed in the sealing layer 300 by processing the sealing layer 300. For example, the processing for the sealing layer 300 may include a grinding process. In some embodiments, the surface roughness of the first inclined surface 331 of the sealing layer 300, which is formed by a grinding process, may be greater than the surface roughness of the upper surface 321 of the sealing layer 300 and the surface roughness of the first side surface 311 of the sealing layer 300. When the surface roughness of the first inclined surface 331 of the sealing layer 300, which is formed by a grinding process, is increased, the adhesion between the first inclined surface 331 and the material of the first marking pattern 410, which is formed by an inkjet method in a subsequent process, may improve.

Next, referring to FIG. 1, the first marking pattern 410 is formed in or on the first inclined surface 331 of the sealing layer 300. The first marking pattern 410 may be formed by laser processing, inkjet printing, or the like.

FIGS. 4 to 9 are diagrams respectively illustrating semiconductor packages 11, 12, 13, 14, 15, and 16 according to some embodiments. Hereinafter, the semiconductor packages 11, 12, 13, 14, 15, and 16 respectively shown in FIGS. 4 to 9 are described with the focus on differences from the semiconductor package 10 described with reference to FIGS. 1 and 2.

Figure 4:
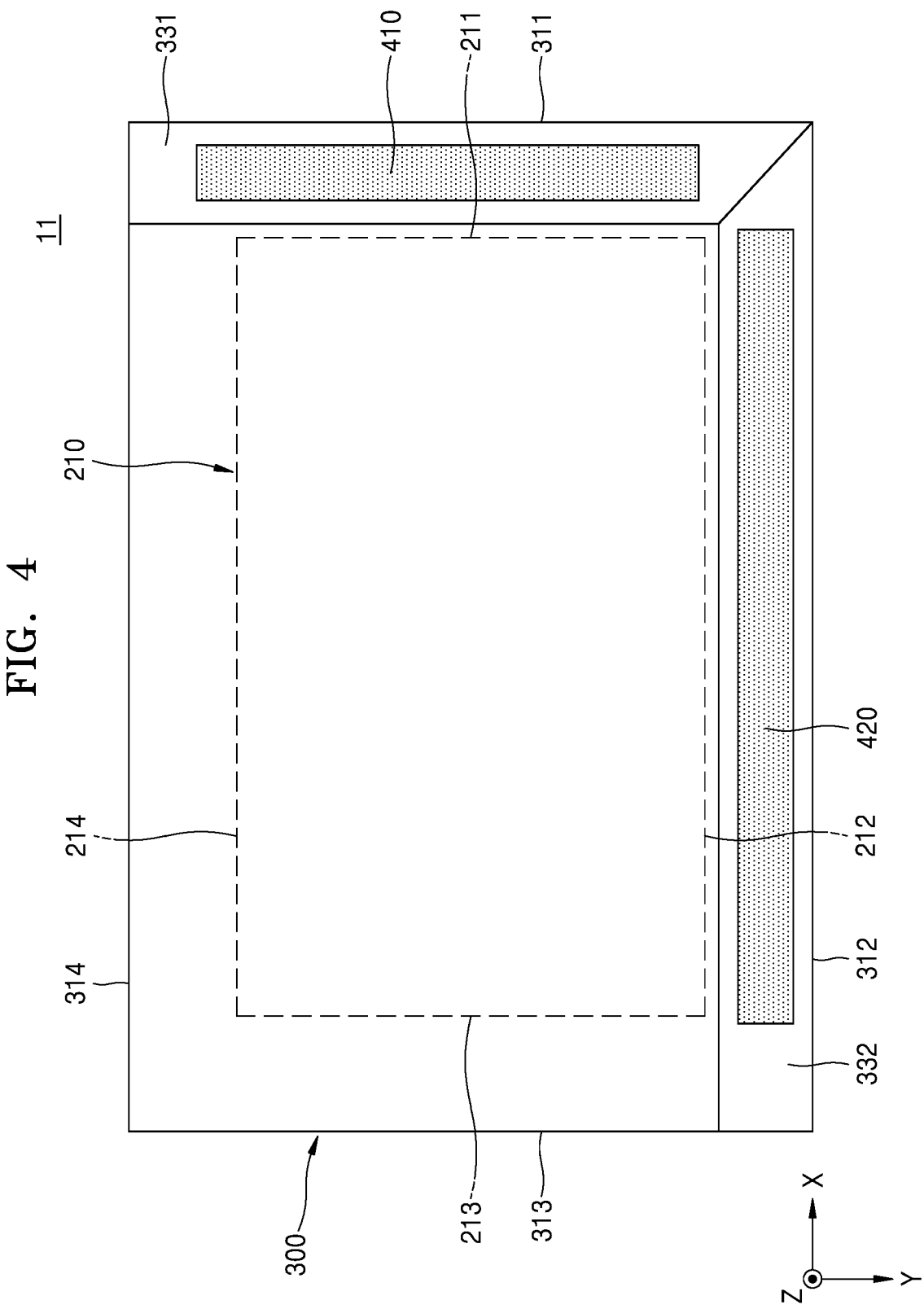
FIG. 4 is a plan view illustrating a semiconductor package according to some embodiments.

FIG. 4 is a plan view illustrating the semiconductor package 11 according to some embodiments.

Referring to FIG. 4, in the semiconductor package 11, the sealing layer 300 may further include a second inclined surface 332 extending between the upper surface 321 and a second side surface 312. The second inclined surface 332 may be connected to the first inclined surface 331. The second inclined surface 332 of the sealing layer 300 may extend obliquely with respect to the extension direction of the upper surface 321 and an extension direction of the second side surface 312 (i.e., the second inclined surface 332 defines a plane that is at an angle to a plane defined by the sealing layer upper surface 321 and a plane defined by the sealing layer second side surface 312). In a cross-sectional view, the second side surface 312 of the sealing layer 300 may extend parallel to the vertical direction (for example, the Z direction), and the second inclined surface 332 of the sealing layer 300 may extend with a tilt with respect to the vertical direction (for example, the Z direction). In some embodiments, in a cross-sectional view, in the sealing layer 300, a contained angle between the second inclined surface 332 and the second side surface 312 may be about 10 degrees to about 80 degrees, about 20 degrees to about 70 degrees, or about 30 degrees to about 60 degrees. The semiconductor package 11 may further include a second marking pattern 420 arranged in or on the second inclined surface 332 of the sealing layer 300. The second marking pattern 420 may have an embossed structure and/or an engraved structure and may be formed by substantially the same method as that of the first marking pattern 410 described above.

Figure 5:
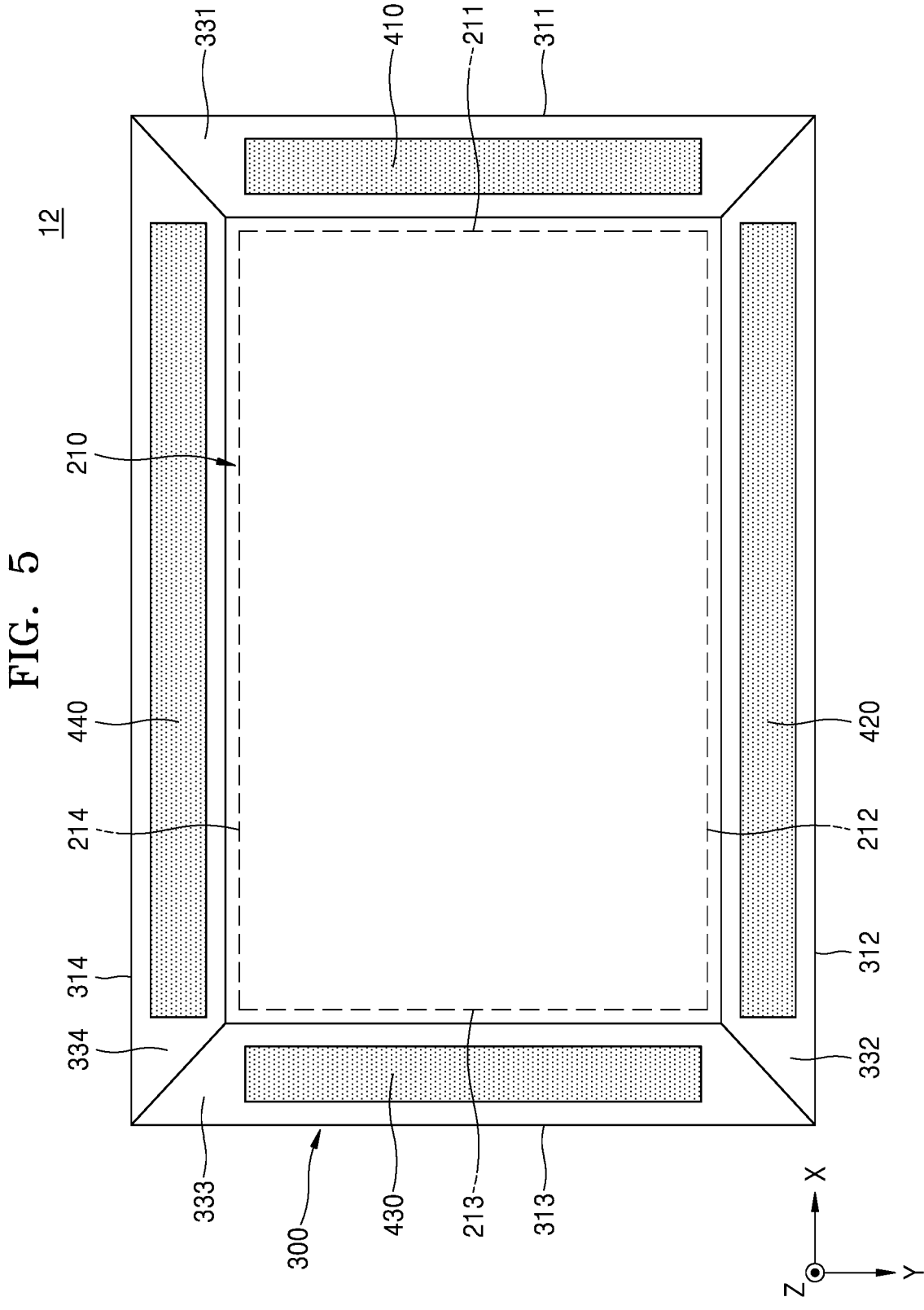
FIG. 5 is a plan view illustrating a semiconductor package according to some embodiments.

FIG. 5 is a plan view illustrating the semiconductor package 12 according to some embodiments.

Referring to FIG. 5, in the semiconductor package 12, the sealing layer 300 may include inclined surfaces provided between the respective side surfaces and the upper surface 321. That is, the sealing layer 300 may include the first inclined surface 331 extending between the upper surface 321 and the first side surface 311 to be oblique with respect to the first side surface 311, the second inclined surface 332 extending between the upper surface 321 and the second side surface 312 to be oblique with respect to the second side surface 312, a third inclined surface 333 extending between the upper surface 321 and a third side surface 313 to be oblique with respect to the third side surface 313, and a fourth inclined surface 334 extending between the upper surface 321 and a fourth side surface 314 to be oblique with respect to the fourth side surface 314. The semiconductor package 12 may include first to fourth marking patterns 410, 420, 430, and 440 respectively arranged in or on the first to fourth inclined surfaces 331, 332, 333, and 334, as illustrated. Each of the second to fourth marking patterns 420, 430, and 440 may have an embossed structure and/or an engraved structure and may be formed by substantially the same method as that of the first marking pattern 410 described above.

Figure 6:
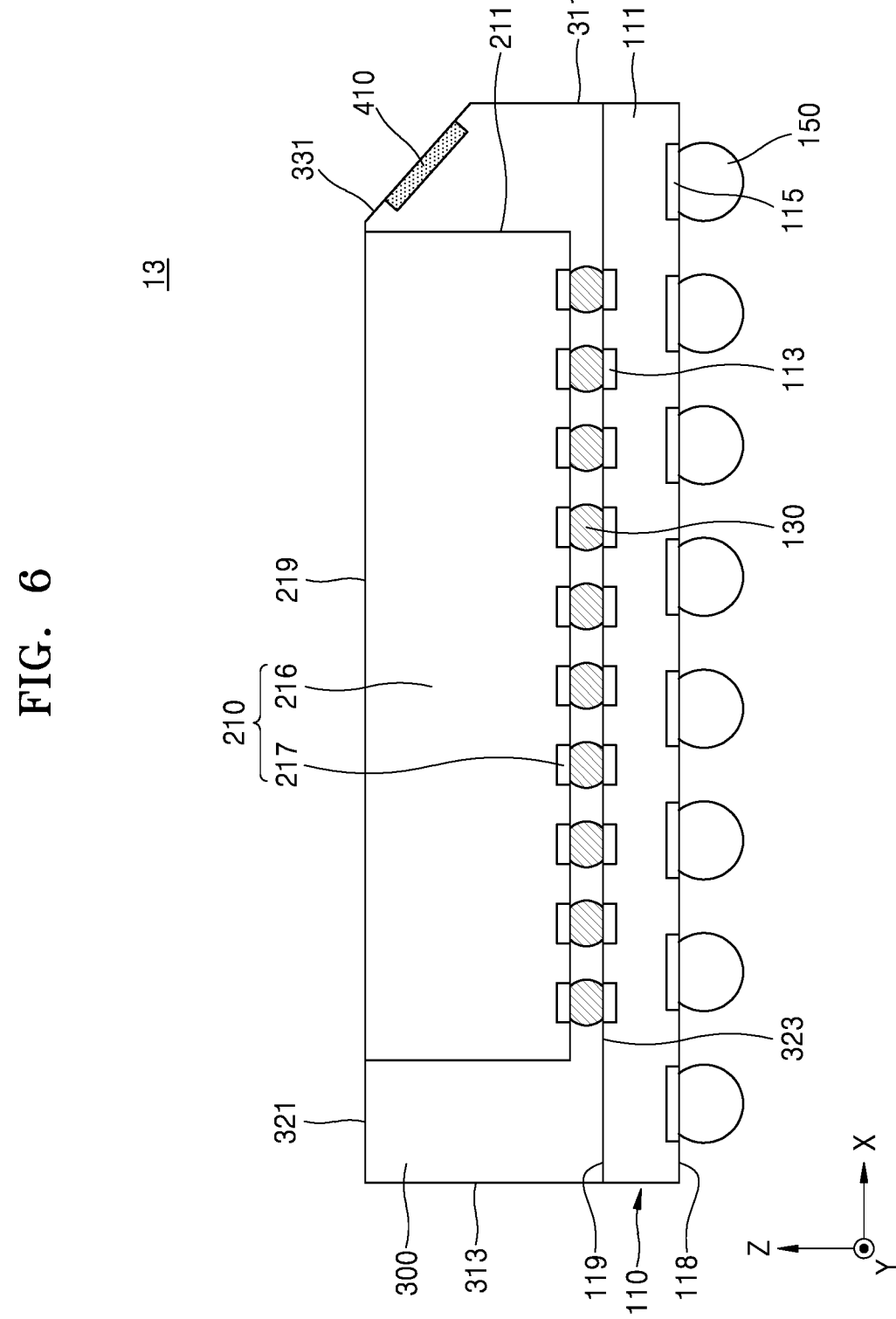
FIG. 6 is a cross-sectional view illustrating a semiconductor package according to some embodiments.

FIG. 6 is a cross-sectional view illustrating the semiconductor package 13 according to some embodiments.

Referring to FIG. 6, in the semiconductor package 13, the upper surface 219 of the first semiconductor chip 210 may be exposed to the outside of the semiconductor package 13. In some embodiments, the upper surface 219 of the first semiconductor chip 210 may be coplanar with the upper surface 321 of the sealing layer 300. Because the upper surface 219 of the first semiconductor chip 210 is exposed to the outside of the semiconductor package 13, heat dissipation characteristics of the first semiconductor chip 210 may improve.

Figure 7:
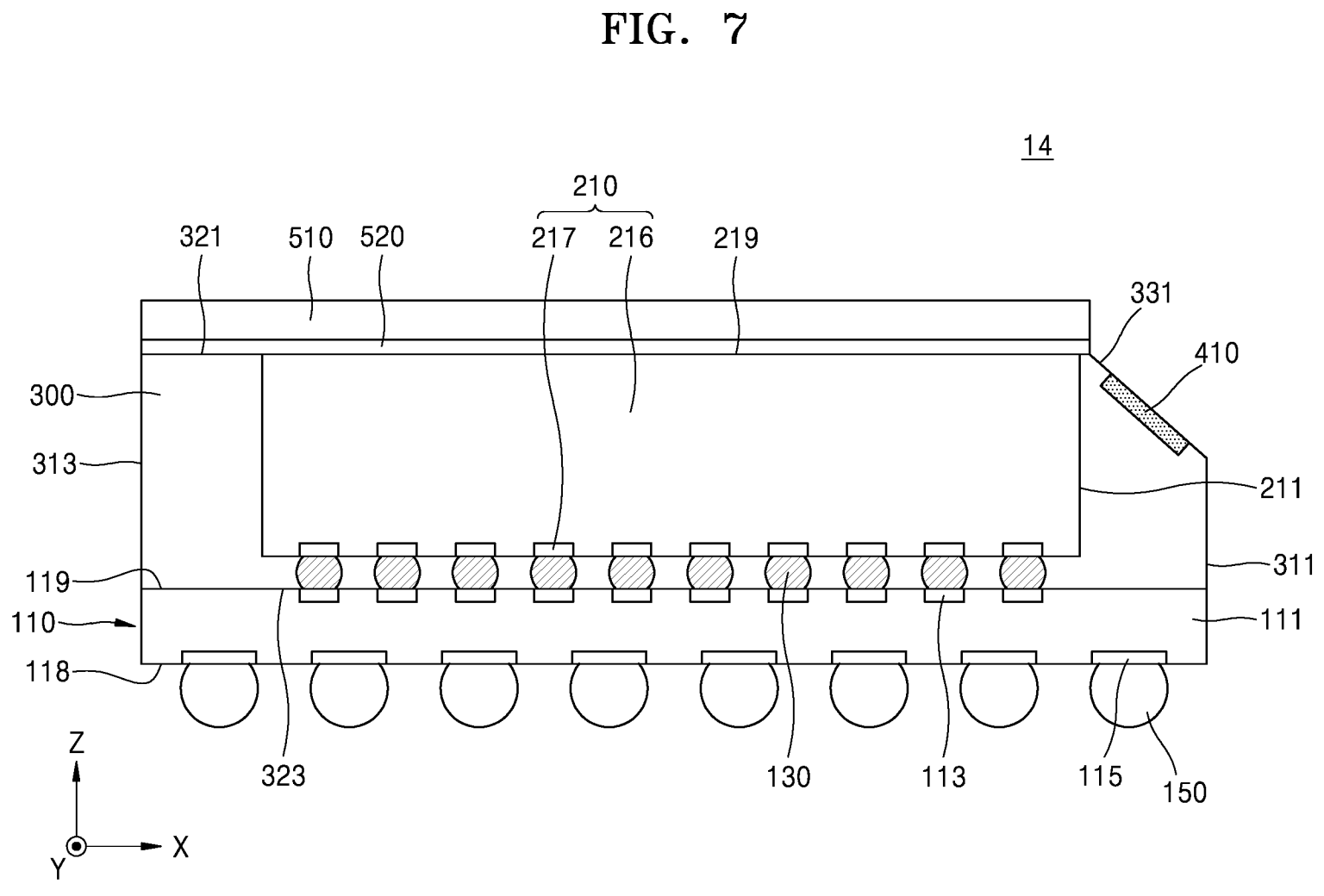

FIG. 7 is a cross-sectional view illustrating the semiconductor package 14 according to some embodiments.

Referring to FIG. 7, the semiconductor package 14 may include a heat dissipation member 510 and a thermal interface material (TIM) layer 520.

The heat dissipation member 510 may be attached onto the upper surface 219 of the first semiconductor chip 210 and the upper surface 321 of the sealing layer 300. The heat dissipation member 510 may include a heat dissipation plate, such as a heat slug or a heat sink. In some embodiments, the heat dissipation member 510 may include a flat plate or a solid figure made of a metal material. For example, the heat dissipation member 510 may include a metal, such as copper (Cu) or aluminum (Al), or a carbon-containing material, such as graphene, graphite, and/or carbon nanotubes.

The TIM layer 520 may be arranged between the heat dissipation member 510 and the upper surface 219 of the first semiconductor chip 210 and between the heat dissipation member 510 and the upper surface 321 of the sealing layer 300. The TIM layer 520 may be configured to attach the heat dissipation member 510 to the upper surface 219 of the first semiconductor chip 210 and the upper surface 321 of the sealing layer 300. The TIM layer 520 may include a thermally conductive and electrically non-conductive material. For example, the TIM layer 520 may include a polymer including metal powder, such as silver or copper, thermal grease, white grease, or a combination thereof.

Figure 8:
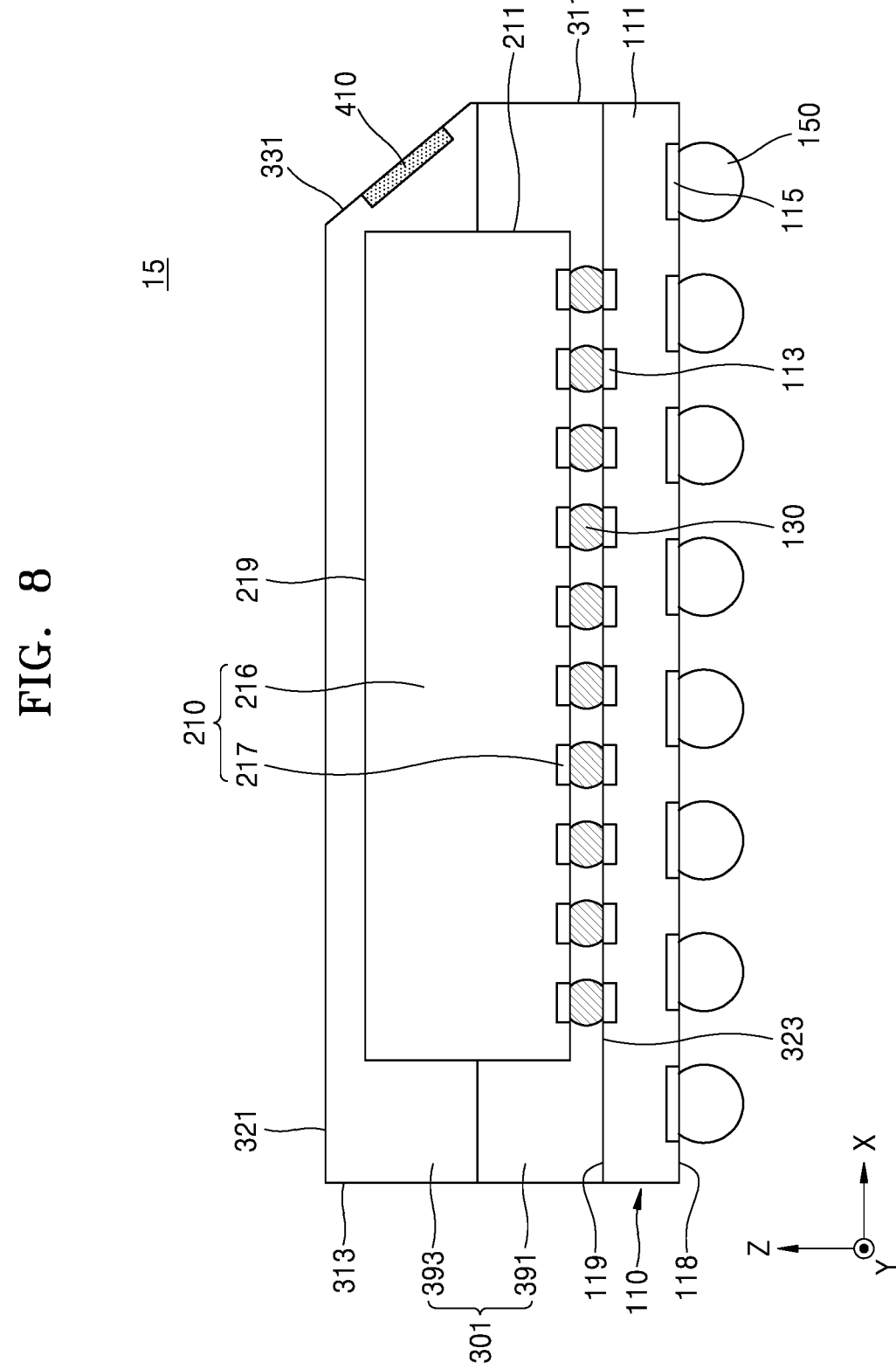
FIG. 8 is a cross-sectional view illustrating a semiconductor package according to some embodiments.

FIG. 8 is a cross-sectional view illustrating the semiconductor package 15 according to some embodiments.

Referring to FIG. 8, in the semiconductor package 15, a sealing layer 301 may include a first sealing layer 391 and a second sealing layer 393. The second sealing layer 393 may be arranged on the first sealing layer 391. The second sealing layer 393 may include the first inclined surface 331 of the sealing layer 301, in which the first marking pattern 410 is provided. The material of the second sealing layer 393 may be different from the material of the first sealing layer 391. The second sealing layer 393 may include a photosensitive material, a photosensitive additive, a thermosensitive material, and/or a thermosensitive additive. For example, the photosensitive material and/or the thermosensitive material of the second sealing layer 393 may react to laser light and be discolored by laser light. To form the first marking pattern 410, when the sealing layer 301 is irradiated with laser light, the photosensitive material and/or the thermosensitive material in the second sealing layer 393 may react with laser light and thus be discolored. Because the first marking pattern 410 has a different color from other regions of the first inclined surface 331 of the sealing layer 301, which are not irradiated with laser light, the visibility of the first marking pattern 410 may improve.

Figure 9:
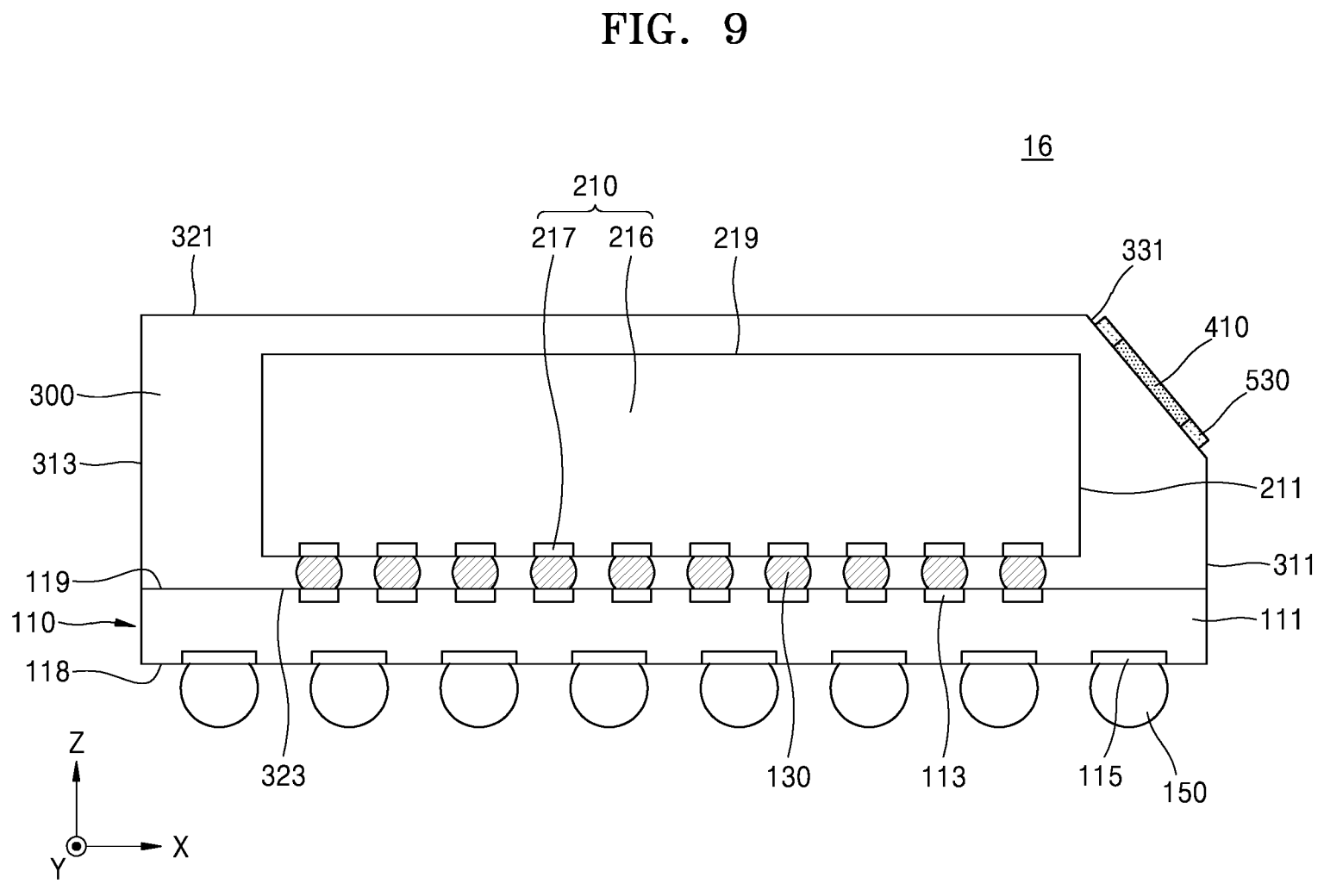

FIG. 9 is a cross-sectional view illustrating the semiconductor package 16 according to some embodiments.

Referring to FIG. 9, the semiconductor package 16 may further include a photoreactive material layer 530 arranged on the first inclined surface 331 of the sealing layer 300. The first marking pattern 410 may be formed in the photoreactive material layer 530. The photoreactive material layer 530 may include a photosensitive material, a photosensitive additive, a thermosensitive material, and/or a thermosensitive additive. For example, the photosensitive material of the photoreactive material layer 530 may react to laser light and be discolored by laser light. For example, the thermosensitive material in the photoreactive material layer 530 may react with laser light and thus be discolored. To form the first marking pattern 410, when the sealing layer 300 is irradiated with laser light, the photosensitive material and/or the thermosensitive material in the photoreactive material layer 530 may react with laser light and thus be discolored. Because the first marking pattern 410 has a different color from other regions of the photoreactive material layer 530, which are not irradiated with laser light, the visibility of the first marking pattern 410 may improve.

Figure 10:
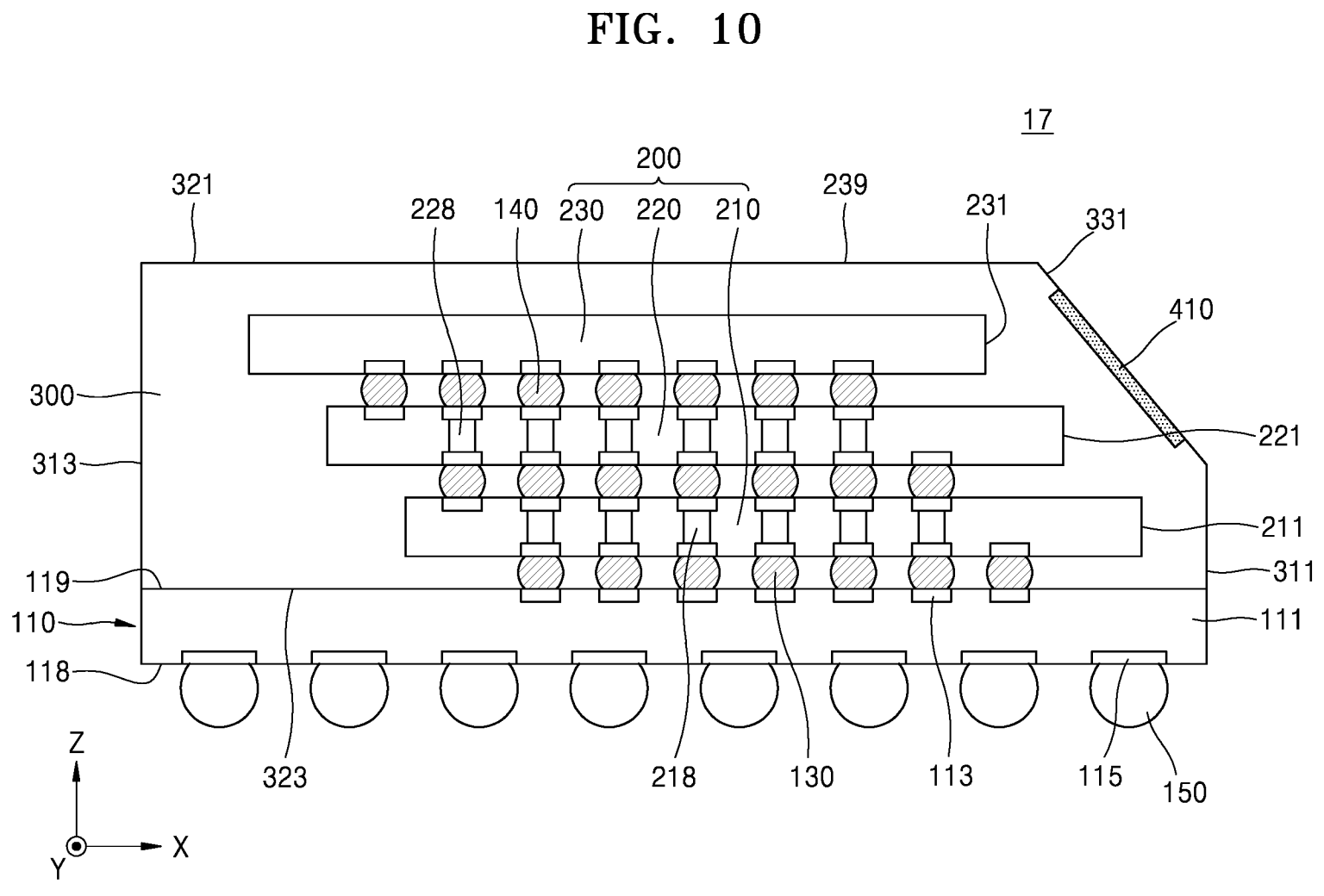
Figure 11:
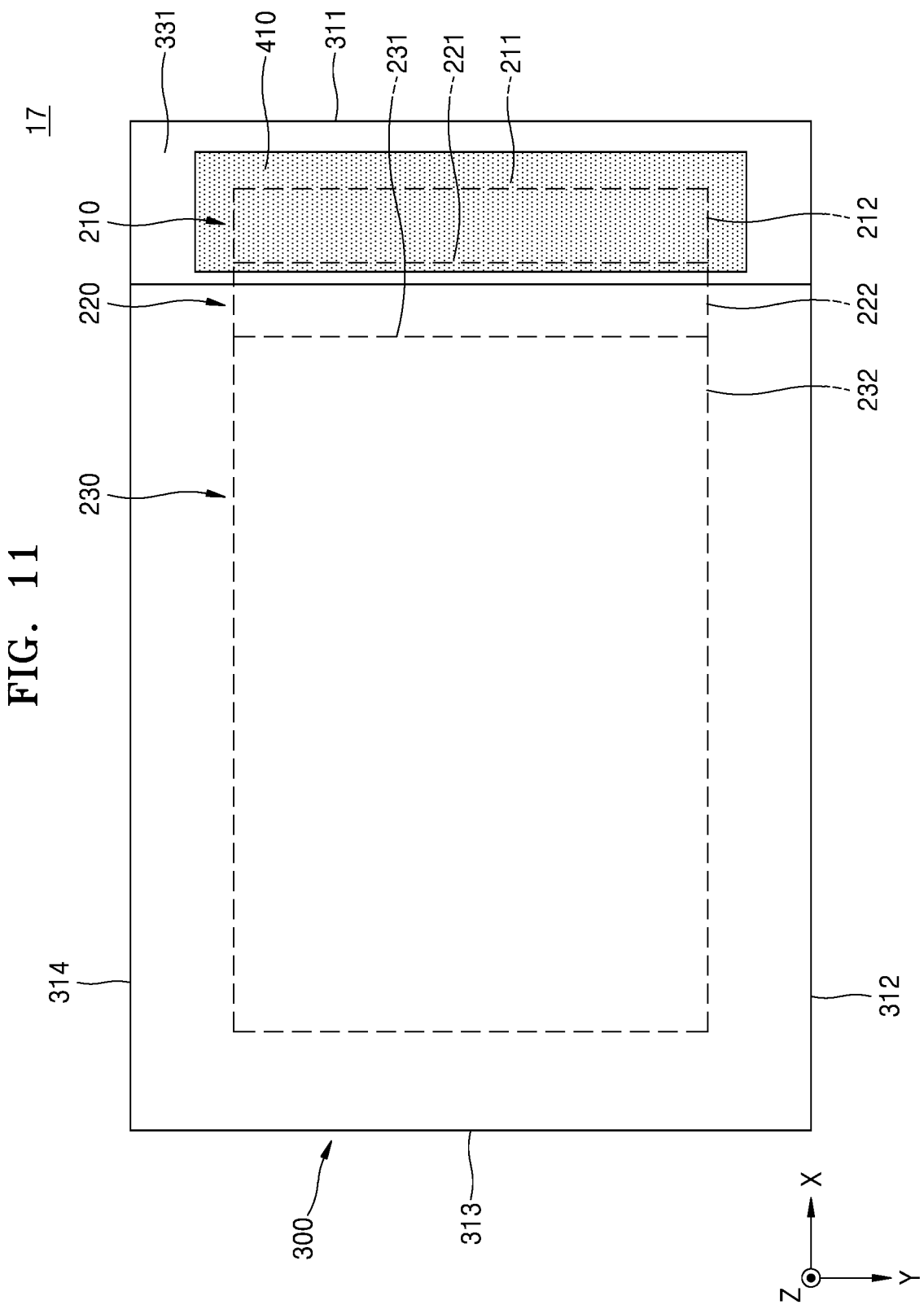
FIG. 11 is a plan view illustrating a semiconductor package according to some embodiments.

FIG. 10 is a cross-sectional view illustrating the semiconductor package 17 according to some embodiments. FIG. 11 is a plan view illustrating the semiconductor package 17 according to some embodiments. Hereinafter, the semiconductor package 17 shown in FIGS. 10 and 11 is described with the focus on differences from the semiconductor package 10 described with reference to FIGS. 1 and 2.

Referring to FIGS. 10 and 11, the semiconductor package 17 may include a chip structure 200 including first to third semiconductor chips 210, 220, and 230 that are stacked in the vertical direction (for example, the Z direction). Although FIGS. 10 and 11 illustrate that the chip structure 200 includes three semiconductor chips, the inventive concept is not limited thereto, and the chip structure 200 may include two semiconductor chips or four or more semiconductor chips.

The first to third semiconductor chips 210, 220, and 230 may have a three-dimensional (3D) stack structure. The first semiconductor chip 210 may be mounted on the package substrate 110 via the first chip connection bumps 130, the second semiconductor chip 220 may be mounted on the first semiconductor chip 210 via inter-chip connection bumps 140, and the third semiconductor chip 230 may be mounted on the second semiconductor chip 220 via the inter-chip connection bumps 140. The first semiconductor chip 210 may include a first through-electrode 218 passing through a semiconductor substrate of the first semiconductor chip 210, and the second semiconductor chip 220 may include a second through-electrode 228 passing through a semiconductor substrate of the second semiconductor chip 220. The second semiconductor chip 220 may be electrically connected to the first through-electrode 218 of the first semiconductor chip 210, and the third semiconductor chip 230 may be electrically connected to the second through-electrode 228 of the second semiconductor chip 220.

In some embodiments, an upper surface of the third semiconductor chip 230 located at the uppermost position from among the first to third semiconductor chips 210, 220, and 230 may be covered by the sealing layer 300. In some embodiments, the upper surface of the third semiconductor chip 230 may be exposed to the outside of the semiconductor package 17, and the upper surface of the third semiconductor chip 230 may be coplanar with the upper surface 321 of the sealing layer 300. In some embodiments, a heat dissipation member may be attached onto the upper surface of the third semiconductor chip 230.

The first to third semiconductor chips 210, 220, and 230 may have substantially equal dimensions to each other. For example, the first to third semiconductor chips 210, 220, and 230 may have equal lengths to each other in a first horizontal direction (for example, the X direction), equal lengths to each other in a second horizontal direction (for example, the Y direction), and equal lengths to each other in the vertical direction (for example, the Z direction). In a plan view, each of the first to third semiconductor chips 210, 220, and 230 may have a rectangular shape. Respective first side surfaces 211, 221, and 231 of the first to third semiconductor chips 210, 220, and 230 may face the first side surface 311 of the sealing layer 300, and respective second surfaces 212, 222, and 232 of the first to third semiconductor chips 210, 220, and 230 may face the second side surface 312 of the sealing layer 300.

In some embodiments, the first to third semiconductor chips 210, 220, and 230 may be sequentially stacked to be offset in the stated order in a first lateral direction. The first lateral direction may be a direction (for example, the X direction) that is perpendicular to the first side surface 311 of the sealing layer 300 and parallel to the upper surface 119 of the package substrate 110. In two semiconductor chips adjacent to each other in the vertical direction (for example, the Z direction) from among the first to third semiconductor chips 210, 220, and 230, a lower semiconductor chip located at a lower position may protrude in the first lateral direction from a first side surface of an upper semiconductor chip located at an upper position. In other words, in the two semiconductor chips adjacent to each other in the vertical direction (for example, the Z direction) from among the first to third semiconductor chips 210, 220, and 230, a distance in the first lateral direction between the upper semiconductor chip and the first side surface 311 of the sealing layer 300 may be greater than a distance in the first lateral direction between the lower semiconductor chip and the first side surface 311 of the sealing layer 300. For example, a portion of the first semiconductor chip 210 may protrude in the first lateral direction from the first side surface 221 of the second semiconductor chip 220, and a portion of the second semiconductor chip 220 may protrude in the first lateral direction from the first side surface 231 of the third semiconductor chip 230. For example, a distance in the first lateral direction between the first side surface 221 of the second semiconductor chip 220 and the first side surface 311 of the sealing layer 300 may be greater than a distance in the first lateral direction between the first side surface 211 of the first semiconductor chip 210 and the first side surface 311 of the sealing layer 300, and a distance in the first lateral direction between the first side surface 231 of the third semiconductor chip 230 and the first side surface 311 of the sealing layer 300 may be greater than the distance in the first lateral direction between the first side surface 221 of the second semiconductor chip 220 and the first side surface 311 of the sealing layer 300.

Here, the first inclined surface 331 of the sealing layer 300 may extend to overlap at least one of the first to third semiconductor chips 210, 220, and 230 in the vertical direction (for example, the Z direction), and the first marking pattern 410 may also overlap at least one of the first to third semiconductor chips 210, 220, and 230 in the vertical direction (for example, the Z direction).

According to some embodiments, in the semiconductor package 17 including a plurality of semiconductor chips stacked in an offset manner, because the first marking pattern 410 is formed in the first inclined surface 331 of the sealing layer 300, which overlaps at least one of the plurality of semiconductor chips, the size reduction of the semiconductor package 17 may be achieved while securing the visibility of the first marking pattern 410.

Figure 12:
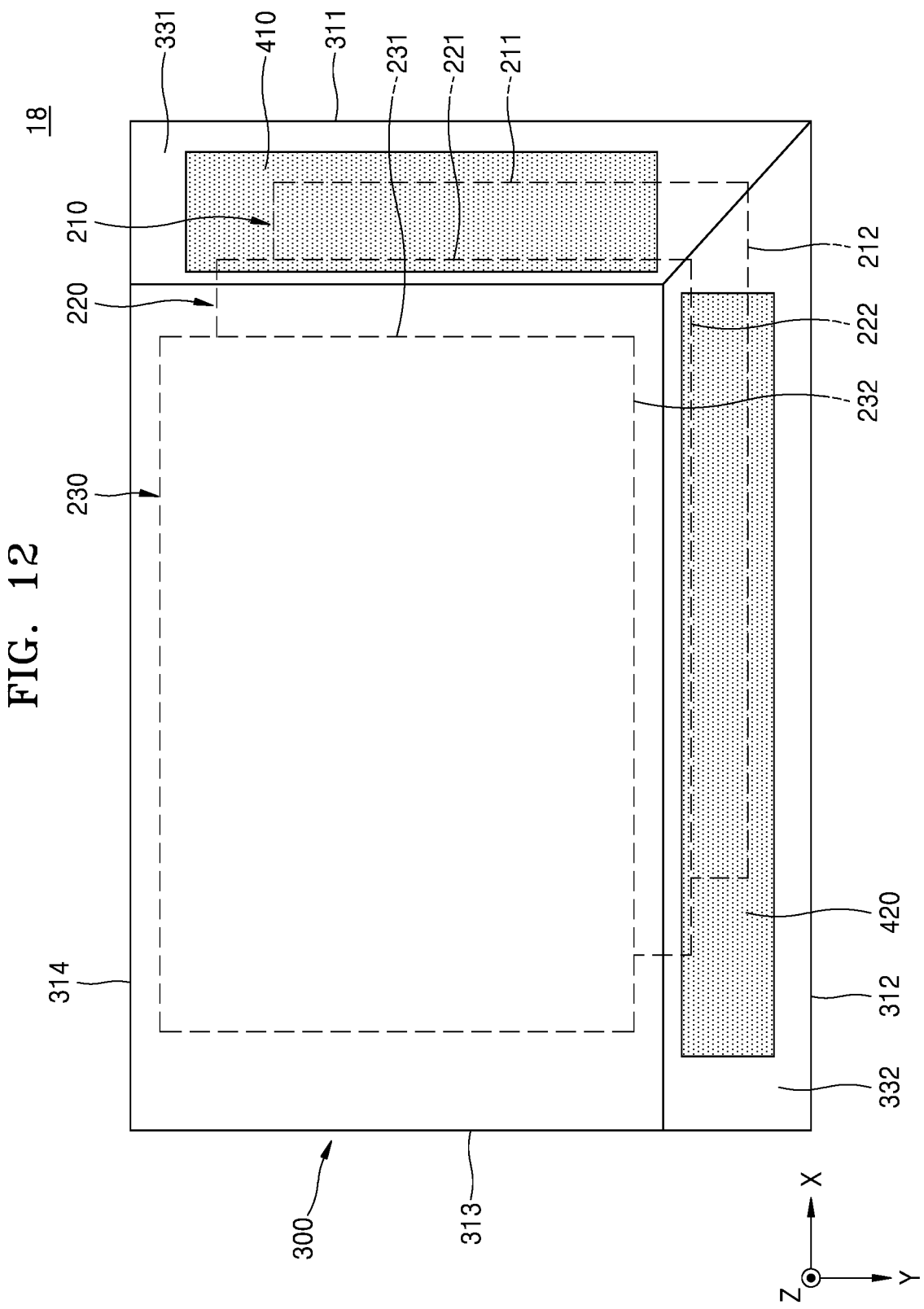
FIG. 12 is a cross-sectional view illustrating a semiconductor package according to some embodiments.

FIG. 12 is a cross-sectional view illustrating a semiconductor package 18 according to some embodiments. Hereinafter, the semiconductor package 18 shown in FIG. 12 is described with the focus on differences from the semiconductor package 17 described with reference to FIGS. 10 and 11.

Referring to FIG. 12, in the chip structure 200 of the semiconductor package 18, the first to third semiconductor chips 210, 220, and 230 may be sequentially stacked to be offset in the stated order in a second lateral direction that is different from the first lateral direction. The second lateral direction may be a direction (for example, the Y direction) that is perpendicular to the second side surface 312 of the sealing layer 300 and parallel to the upper surface 119 of the package substrate 110. In two semiconductor chips adjacent to each other in the vertical direction (for example, the Z direction) from among the first to third semiconductor chips 210, 220, and 230, a lower semiconductor chip located at a lower position may protrude in the second lateral direction from a second side surface of an upper semiconductor chip located at an upper position. In other words, in the two semiconductor chips adjacent to each other in the vertical direction (for example, the Z direction) from among the first to third semiconductor chips 210, 220, and 230, a distance in the second lateral direction between the upper semiconductor chip and the second side surface 312 of the sealing layer 300 may be greater than a distance in the second lateral direction between the lower semiconductor chip and the second side surface 312 of the sealing layer 300. For example, a portion of the first semiconductor chip 210 may protrude in the second lateral direction from the second side surface 222 of the second semiconductor chip 220, and a portion of the second semiconductor chip 220 may protrude in the second lateral direction from the second side surface 232 of the third semiconductor chip 230. For example, a distance in the second lateral direction between the second side surface 222 of the second semiconductor chip 220 and the second side surface 312 of the sealing layer 300 may be greater than a distance in the second lateral direction between the second side surface 212 of the first semiconductor chip 210 and the second side surface 312 of the sealing layer 300, and a distance in the second lateral direction between the second side surface 232 of the third semiconductor chip 230 and the second side surface 312 of the sealing layer 300 may be greater than the distance in the second lateral direction between the second side surface 222 of the second semiconductor chip 220 and the second side surface 312 of the sealing layer 300.

The sealing layer 300 may further include the second inclined surface 332 extending between the upper surface 321 and the second side surface 312. The second inclined surface 332 may be connected to the first inclined surface 331. The second inclined surface 332 of the sealing layer 300 may extend obliquely with respect to the extension direction of the upper surface 321 and the extension direction of the second side surface 312. The semiconductor package 18 may further include the second marking pattern 420 arranged in or on the second inclined surface 332 of the sealing layer 300. The second marking pattern 420 may have an embossed structure and/or an engraved structure and may be formed by substantially the same method as that of the first marking pattern 410 described above. The second inclined surface 332 of the sealing layer 300 may extend to overlap at least one of the first to third semiconductor chips 210, 220, and 230 in the vertical direction (for example, the Z direction), and the second marking pattern 420 may also overlap at least one of the first to third semiconductor chips 210, 220, and 230 in the vertical direction (for example, the Z direction).

While the inventive concept has been particularly shown and described with reference to embodiments thereof, it will be understood that various changes in form and details may be made therein without departing from the scope of the following claims.

What is claimed is:

1. A semiconductor package comprising:
a package substrate;
a first semiconductor chip on the package substrate;
a sealing layer on the package substrate and at least partially covering the first semiconductor chip, the sealing layer comprising an upper surface extending in a first direction, a first side surface that extends in a second direction transverse to the first direction, and a first inclined surface having a first portion and a second portion, each of the first portion and the second portion extending between and in a third direction transverse to the upper surface and the first side surface; and
a first information marking pattern in or on the first portion of the first inclined surface of the sealing layer, wherein no information marking pattern is in or on the second portion of the first inclined surface of the sealing layer.

2. The semiconductor package of claim 1, wherein the sealing layer covers an upper surface of the first semiconductor chip.

3. The semiconductor package of claim 1, wherein the upper surface of the sealing layer is coplanar with an upper surface of the first semiconductor chip.

4. The semiconductor package of claim 3, wherein the upper surface of the first semiconductor chip is exposed to an outside of the semiconductor package.

5. The semiconductor package of claim 3, further comprising a heat dissipation member attached to the upper surface of the first semiconductor chip.

6. The semiconductor package of claim 1, wherein the sealing layer further comprises a second side surface and a second inclined surface extending between the upper surface and the second side surface of the sealing layer, and
wherein the semiconductor package further comprises a second marking pattern in or on the second inclined surface of the sealing layer.

7. The semiconductor package of claim 1, further comprising a second semiconductor chip stacked on the first semiconductor chip,
wherein a distance in a first lateral direction between the first side surface of the sealing layer and the second semiconductor chip is greater than a distance in the first lateral direction between the first side surface of the sealing layer and the first semiconductor chip, and
wherein the first lateral direction is perpendicular to the first side surface of the sealing layer.

8. The semiconductor package of claim 7, wherein the sealing layer further comprises a second side surface and a second inclined surface extending between the upper surface and the second side surface of the sealing layer,
wherein the semiconductor package further comprises a second marking pattern in or on the second inclined surface of the sealing layer,
wherein a distance in a second lateral direction between the second side surface of the sealing layer and the second semiconductor chip is greater than a distance in the second lateral direction between the second side surface of the sealing layer and the first semiconductor chip, and
wherein the second lateral direction is perpendicular to the second side surface of the sealing layer.

9. The semiconductor package of claim 8, wherein the first side surface of the sealing layer and the second side surface of the sealing layer are connected to each other.

10. The semiconductor package of claim 1, wherein the first side surface extends parallel to a first plane, the first inclined surface extends parallel to a second plane, and an angle between the first plane and the second plane is about 10 degrees to about 80 degrees.

11. The semiconductor package of claim 1, wherein the sealing layer comprises a first sealing layer on the package substrate and a second sealing layer on the first sealing layer,
wherein the second sealing layer comprises the first inclined surface, and
at least one of a photosensitive material and a thermosensitive material.

12. The semiconductor package of claim 1, further comprising a photoreactive material layer on the first inclined surface of the sealing layer, the photoreactive material layer comprising at least one of a photosensitive material and a thermosensitive material, and
wherein the first information marking pattern is in the photoreactive material layer.

13. The semiconductor package of claim 1, wherein the first information marking pattern comprises a groove in the first inclined surface of the sealing layer.

14. The semiconductor package of claim 1, wherein the first information marking pattern comprises a material layer applied to the first inclined surface of the sealing layer, and
wherein a surface roughness of the first inclined surface is greater than a surface roughness of the upper surface of the sealing layer and a surface roughness of the first side surface of the sealing layer.

15. A semiconductor package comprising:
a package substrate;

a chip structure on an upper surface of the package substrate and comprising a plurality of semiconductor chips stacked in a first direction that is perpendicular to the upper surface of the package substrate;

a sealing layer on the package substrate and at least partially covering the chip structure, the sealing layer comprising an upper surface extending in a second direction, a first side surface that extends in the first direction transverse to the second direction, and a first inclined surface extending between and transverse to the upper surface and the first side surface; and a first marking pattern in or on the first inclined surface of the sealing layer, the first marking pattern having a portion that is in or on the first inclined surface and overlies and is aligned with at least one of the plurality of semiconductor chips in the first direction, wherein a distance in a first lateral direction between a first one of the plurality of semiconductor chips and the first side surface of the sealing layer is greater than a distance in the first lateral direction between a lower second one of the plurality of semiconductor chips and the first side surface of the sealing layer.

16. The semiconductor package of claim 15, wherein the sealing layer further comprises a second side surface and a second inclined surface extending between the upper surface and the second side surface of the sealing layer, wherein the semiconductor package further comprises a second marking pattern in or on the second inclined surface of the sealing layer, and, wherein a distance in a second lateral direction between the first one of the plurality of semiconductor chips and the second side surface of the sealing layer is greater than a distance in the second lateral direction between the second one of the plurality of semiconductor chips and the second side surface of the sealing layer.

17. The semiconductor package of claim 15, wherein an upper surface of an uppermost one of the plurality of semiconductor chips is coplanar with the upper surface of the sealing layer.

18. The semiconductor package of claim 17, further comprising a heat dissipation member attached to the upper surface of the uppermost one of the plurality of semiconductor chips.

19. The semiconductor package of claim 15, wherein the first marking pattern is configured to visually convey information about the semiconductor package.

20. A semiconductor package comprising:

a package substrate;

a chip structure on an upper surface of the package substrate and comprising a plurality of semiconductor chips stacked in a first direction that is perpendicular to the upper surface of the package substrate;

a sealing layer on the package substrate and at least partially covering the chip structure, the sealing layer comprising an upper surface extending in a second direction, a first side surface that extends in the first direction transverse to the second direction, a second side surface, a first inclined surface having a first portion and a second portion, each of the first portion and the second portion extending between and in a third direction transverse to the upper surface and the first side surface, and a second inclined surface extending between the upper surface and the second side surface;

a first information marking pattern in or on the first portion of the first inclined surface of the sealing layer and overlying at least one of the plurality of semiconductor chips in the first direction; and a second marking pattern in or on the second inclined surface of the sealing layer and overlying at least one of the plurality of semiconductor chips, wherein the first inclined surface of the sealing layer and the second inclined surface of the sealing layer are connected to each other, wherein a distance in a first lateral direction between a first one of the plurality of semiconductor chips and the first side surface of the sealing layer is greater than a distance in the first lateral direction between a lower second one of the plurality of semiconductor chips and the first side surface of the sealing layer, wherein a distance in a second lateral direction between the first one of the plurality of semiconductor chips and the second side surface of the sealing layer is greater than a distance in the second lateral direction between the second one of the plurality of semiconductor chips and the second side surface of the sealing layer, and wherein no information marking pattern is in or on the second portion of the first inclined surface of the sealing layer.

* * * * *